United States Patent Office 3,699,018
Patented Oct. 17, 1972

3,699,018

METHOD OF ELECTRODEPOSITING CORAL COPPER ON COPPER FOIL

Clarence A. Carlson, West Salem, Wis., assignor to Northern Engraving Company

No Drawing. Filed July 12, 1971, Ser. No. 162,004
Int. Cl. C23b 5/20, 5/50
U.S. Cl. 204—52 R 3 Claims

ABSTRACT OF THE DISCLOSURE

A process for electrodepositing coral copper on copper foil which uses a plating bath which consists essentially of copper sulfamate, sulfamic acid, sodium dihexyl sulfosuccinate and water. Utilizing this plating bath with little, if any, agitation and current densities between 75 and 140 amperes per square foot, coral, or nodularized copper can be deposited upon the copper foil.

BACKGROUND OF THE INVENTION

This invention relates to the electrodeposition of copper coral on copper foil; and in particular is directed to a novel plating bath and plating parameters.

In the manufacture of printed circuits, copper foil is adhered to a substrate and then portions of the foil are etched away so as to leave a copper pattern that defines the desired electrically conductive paths. One problem in the art has been to provide sufficient adherence between the copper foil conductor and the substrate.

Proper adherence has been achieved by providing a roughened surface on the copper foil which when embedded in the substrate effects an excellent bond with a plastic or resin substrate. In this application the roughened surface on the copper foil is referred to as "coral" copper. The roughness that aids in bonding the copper foil to the substrate provides integral with the copper foil a plurality of projections which become surrounded by the plastic material of the substrate to interlock therewith. Coral copper appears to be similar to a copper formation heretofore described as "nodularized" in U.S. Pat. No. 3,220,897, wherein the nodularized copper surface is defined as a relatively rough surface having promontories which are extensions of the grains or crystals of the copper comprising the foil. The said patent discloses a method that utilizes a plating bath containing halogen ions and proteinaceous material and requires agitation of the bath.

SUMMARY OF THE INVENTION

There is provided by this invention the formation of coral copper by a process which does not require use of halogens or proteinaceous materials, but which achieves a coral or roughened deposit on copper foil by utilization of lower copper concentrations in the bath solution, and by using a plating bath that consists essentially of an aqueous solution of copper sulfamate, sulfamic acid, and sodium dihexyl sulfosuccinate.

DESCRIPTION OF THE PREFERRED EMBODIMENT

Using the process described hereinafter copper coral can be deposited upon the surface of copper foil. The term "copper coral" as used herein is intended to denote a coral-like surface which is electrodeposited on a smooth copper foil surface. The coral surface has the characteristics of being a porous skeletal structure which is adhered to the surface of the copper foil and has an appearance similar to sea coral. The coral-surfaced copper foil may then be adhered to the resinous substrate from which portion of the copper is subsequently removed by preferential etching. One problem which has existed in the prior art is that, after etching, the resinous surface may stain due to the presence of a nodularized copper surface. However, the substrate exhibits little, if any, staining when copper coral made in accordance with the instant invention is used.

The copper foil on which the copper coral is to be deposited is immersed in a plating bath and forms the cathode. The plating bath used herein consists essentially of copper sulfamate, sulfamic acid, sodium dihexyl sulfosuccinate and water. Copper sulfamate and sulfamic acid can be prepared by dissolving cupric oxide (CuO) in distilled water containing sulfamic acid ($HSO_3NH_2$). The resulting solution after filtration for suspended insolubles includes cupric sulfamate and free sulfamic acid. Sodium dihexyl sulfosuccinate is also added to the bath in relatively small amounts in order to provide a more uniform coral coating. Sodium dihexyl sulfosuccinate may be purchased from American Cyanamid Company under the trade name Aerosol M. A. This product contains about 80% sodium dihexyl sulfosuccinate.

After the foil is immersed in the bath the electrodeposition process is begun while maintaining an appropriate current density and bath temperature for an appropriate length of time. It has been found that when the plating bath has (a) a copper concentration of about 25 grams per liter, (b) a free sulfamic acid concentration between 75 and 150 grams per liter, and (c) a current density in the range of 125 amperes per square foot then with little, if any, bath agitation, porous copper coral will be deposited on the copper foil cathode. In general, porous coral structure can be successfully produced when (a) the bath copper concentration is maintained at a relatively low level (i.e., 25 grams per liter or less), (b) the current density at a relatively high level (125 a.s.f.), and (c) there is little, if any, circulation of the bath. On the other hand, if the copper concentration is high or there is a large amount of bath agitation, a high current density is necessary in order to form the porous coral which provides the maximum of adhesion and minimum of staining. With all other factors remaining constant as disclosed in the above specific example, when the copper concentration is increased the coarseness of the coral deposit also increases and thus yields a higher bond strength. However, the coarse copper coral exhibits a greater staining tendency. Reducing the copper concentration to a low level produces a fine dense coral structure which in turn produces a weaker bond between the resinous substrate and the copper foil. With this weaker bond the tendency to stain is less. Increasing the current density in the example above yields a fine grain dense structure. If the current density is too high a poor bond is formed between the copper foil and the copper coral and the coral-like surface may be abraded off.

Treatment time affects the thickness of the coating which in turn is related to adhesion and staining. The thicker coatings will adhere better but stain more; whereas the thinner coatings will have poorer adhesion characteristics and stain less. The bath temperature also affects the coral formation and is preferably maintained in the range of 75–90° F. At increased temperatures the coral formation is inhibited but this reduced coral formation can be countered by increasing the current density. The free sulfamic acid concentration is preferably maintained in the range between 100 and 130 grams per liter. Increased acid concentrations promote better current conduction and thus lowers the power requirements for the process. In general, the copper concentration should be in the range of between 10 and 25 grams per liter as calculated on the basis of the copper present in cupric sulfamate. The free sulfamic acid is calculated on the basis of the sulfamic acid left after the formation of cupric sulfamate as described above.

The copper foil upon which the copper coral is to be deposited can be prepared in essentially the same bath as the copper coral is to be prepared in. The copper foil may be deposited upon the rotating drum as known in the art and described in the above identified United States patent wherein the bath includes about 25 grams per liter, copper calculated on the basis of cupric sulfamate: between 75 and 150 grams per liter of free sulfamic acid with the current density being approximately 75 amperes per square foot and there being vigorous agitation. The bath temperature will be maintained between about 75 and 90° F. Using baths which have been modified to contain between 100 and 130 grams per liter of free sulfamic acid, there being little if any agitation, and the current density being between 75 and 140 amperes per square foot, the copper coral can be deposited.

Beginning with copper foil made either by the process described hereinabove or provided by other processes a copper coral surface can be deposited on the copper foil using a bath and deposition parameters as described hereinafter. Copper sulfamate and free sulfamic acid are prepared as follows: 25 to 27 grams of cupric oxide powder are dissolved in 500 milliliters of distilled water which contains 150 to 160 grams of sulfamic acid. The resulting reaction converts cupric oxide to cupric sulfamate having 18 to 22 grams per liter copper and leaves about 120 grams per liter of free sulfamic acid. The solution is then diluted to one liter with distilled water. Filtration of the final solution to remove insolubles may be necessary depending upon the purity of cupric oxide and the sulfamic acid. To this solution there is added 0.3 to 0.5 gram per liter of an 80% solution of sodium dihexyl sulfosuccinate. This solution may then be used as the plating bath from which the copper coral is deposited. The bath temperature is maintained between 75 and 90° F. and a current density between 120 and 140 amperes per square foot. The bath is mildly agitated and the foil is maintained in the bath for 45 to 60 seconds. The coral surfaced copper foil is then removed and is observed to have a medium grain density.

The copper foil and coral are then laminated to a resinous sheet, which in this case may be an epoxy sheet, by pressing the coral side of the foil into the sheet with the force of about 1,000 pounds per square inch while heated at 350° F. Under these conditions the fluid epoxy surface flows into the interstices of the copper coral and upon hardening a mechanical interlock is formed therebetween. The bond strength is then tested and measured in terms of the force necessary to pull a 1 inch wide strip of copper foil from the rigid base material when peeled in an angle of 90° to the substrate or base plane and at a rate of 12 inches per minute. Using this procedure it has been found that the bond strength of the coral produced in the process hereinbefore described was between 12 and 14 pounds per inch. Furthermore, after etching with ferric chloride ($FeCl_3$) there was very little staining.

A more dense fine grained coral surface is produced within the scope of this invention by the process described as follows. A plating bath was produced from the above identified constituents which consisted essentially of 12 to 14 grams per liter copper, 120 grams per liter free sulfamic acid, 0.3 to 0.5 gram per liter of an 80% solution of sodium dihexyl sulfosuccinate and the balance being water. The bath temperature was maintained between 75 and 90° F. while the current density was maintained between 75 and 100 amperes per square foot. The foil was treated for between 15 and 30 seconds with there being no bath agitation. The bond strength determined as described above was between 10 and 11 pounds per square inch and when tested for staining there was no visible staining.

It will be appreciated that numerous changes and modifications can be made to the process described herein within the limitations set forth without departing from the spirit and scope of this invention.

What I claim and desire to secure by Letters Patent of the United States is:

1. A process for electrodepositing copper coral on a copper foil surface comprising the steps of:

exposing a copper foil as a cathode to a plating bath for between 15 and 60 seconds, said bath consisting essentially of:

(a) between about 10 and 25 grams per liter copper, calculated as the metal from cupric sulfamate;

(b) between about 100 and 130 grams per liter free sulfamic acid;

(c) between about 0.25 and 0.40 gram per liter sodium dihexyl sulfosuccinate; and (d) the balance water.

and maintaining the bath temperature between 75° F. and 90° F. and applying and maintaining the current density between 75 and 140 amperes per square foot.

2. A process as in claim 1 wherein the copper concentration is between about 18 and 22 grams per liter, the sulfamic acid concentration is about 120 grams per liter, the current density is maintained between 120 and 140 amperes per square foot, the treatment time is maintained between 45 and 60 seconds, and the bath is slightly agitated.

3. A process is claimed as in claim 1 wherein the copper concentration is between 12 and 14 grams per liter, the sulfamic acid concentration is about 120 grams per liter, the current density is maintained between 75 and 100 amperes per square foot, and the treatment time is maintained between 15 and 30 seconds.

References Cited

UNITED STATES PATENTS

| | | | |
|---|---|---|---|
| 2,318,592 | 5/1943 | Cupery | 204—49 |
| 2,389,135 | 11/1945 | Brown | 204—49 |
| 3,288,690 | 11/1966 | Creirtz et al. | 204—52 R |
| 3,220,897 | 11/1965 | Couley et al. | 204—52 R X |

OTHER REFERENCES

J. Industrial and Engineering Chemistry, vol. 33, 16, January 1941.

F. C. EDMUNDSON, Primary Examiner